(12) United States Patent
Kitagawa

(10) Patent No.: US 7,084,730 B2
(45) Date of Patent: Aug. 1, 2006

(54) CHIP COIL AND PRINTED CIRCUIT BOARD FOR THE SAME

(75) Inventor: Masaki Kitagawa, Ina (JP)

(73) Assignee: Koa Kabushiki Kaisha, Ina (JP)

( * ) Notice: Subject to any disclaimer, the term of this patent is extended or adjusted under 35 U.S.C. 154(b) by 0 days.

(21) Appl. No.: 10/923,508

(22) Filed: Aug. 23, 2004

(65) Prior Publication Data

US 2005/0057334 A1  Mar. 17, 2005

(30) Foreign Application Priority Data

Aug. 21, 2003 (JP) ............................. 2003-297681
May 26, 2004 (JP) ............................. 2004-156730

(51) Int. Cl.
*H01F 5/00* (2006.01)
(52) U.S. Cl. .......................... 336/200; 336/83; 336/192
(58) Field of Classification Search ................ 336/83, 336/200, 65, 192, 232
See application file for complete search history.

(56) References Cited

U.S. PATENT DOCUMENTS 6,144,280 A * 11/2000 Amada et al. ............... 336/192
6,154,114 A * 11/2000 Takahashi ................... 336/200
6,680,664 B1 * 1/2004 Fan ............................... 336/83

FOREIGN PATENT DOCUMENTS

JP           9-219318 A       8/1997

* cited by examiner

*Primary Examiner*—Tuyen T Nguyen
(74) *Attorney, Agent, or Firm*—Smith Patent Office

(57) ABSTRACT

Electrodes and land patterns are provided at no magnetic flux concentrated positions or at positions that influence the magnetic fluxes issued from the core of a chip coil. The chip coil has a pair of electrodes which is formed at the center of a base on which a core of the chip coil is mounted, lead frames, flange-shaped brims, conductive parts and a conductive wire. The ends of the conductive wire are connected to internal electrodes which are provided on both brims, respectively, and external electrodes are extended so as to protrude from the sides of a core drum. Also, the signal patterns and the land patterns are arranged at the positions that do not allow overlapping with the brims of the core of the chip coil. This allows implementation of a chip coil and a printed circuit board for the same that allow reduction in magnetic loss.

10 Claims, 13 Drawing Sheets

CHIP COIL AND PRINTED CIRCUIT BOARD FOR THE SAME

BACKGROUND OF THE INVENTION

1. Field of the Invention

The present invention relates to a chip coil and a printed circuit board for the same, which are used for, for example, compact communication equipment, electronic devices or the like.

2. Description of the Related Art

As sizes and weights of electronic devices are reduced, requests for reduction in size (integration onto a chip) of electronic components increase. Coils which are used for various communication equipment are not exceptions, and coils and inductors, which are chip electronic components to be used by mounting on those communication equipment, have been developed.

As disclosed in Japanese Patent Application Laid-Open No. 9-219318, for example, a chip inductor, which is a chip electronic component, forms a coil made by winding a conductive wire around a square pole winding drum, which has flange-shaped brims protruding from both edges. And, formed on part of the end faces of those brims are plated electrodes.

FIG. 20 shows an example of a configuration of a conventional chip inductor. This chip inductor 960 has electrodes 965 and 967, which are formed on the entire surface of the brims of a core, and is mounted upon a printed circuit board (not shown in the drawing) so that the direction of the length thereof can be the same as the running direction of patterns 961 and 963, which are signal lines on that printed circuit board. In other words, as shown in FIG. 21, the conventional chip inductor has signal lines 961 and 963 and land patterns at positions of preventing magnetic fluxes 971 and 973 of a coil when mounted on the printed circuit board.

In addition, the results from carrying out an electromagnetic field simulation considering magnetic flux concentration distribution of the core in the above-described conventional chip inductor show that, as shown in FIG. 22, concentration of magnetic fluxes has occurred at the portions indicated by symbols (O) in the brims 962 and 964, which are components of the core. In other words, as is seen from FIGS. 20 and 22, the conventional chip inductor has a configuration where electrodes 965 and 967 are formed at the magnetic flux concentrated portions of the core.

There are problems with the conventional inductor in which the above-described configuration causes increase in magnetic loss and decrease in the Q value of inductor.

There is another problem with the conventional inductor in which the wiring pattern for mounting the inductor on the printed circuit board may prevent the magnetic fluxes from normally running due to the positions of the electrodes.

The present invention has been developed in view of the above-described problems, and aims to provide a chip coil and a printed circuit board for the same, which reduce magnetic loss and prevent decrease in sensitivity characteristics and the Q value and are suitable for use as an antenna for wireless communications by mounting on various wireless communication equipment (e.g., radio frequency identification (RFID)).

In addition, another objective of the present invention is to provide a chip coil and a printed circuit board for the same, which allow an arrangement of wiring patterns that reduce magnetic loss and prevent decrease in the Q value when mounted on the printed circuit board.

SUMMARY OF THE INVENTION

The present invention has a configuration to achieve the above objectives and solve the above-described problems. In other words, a chip coil according to the present invention is made up of a core including a drum and brims provided on both ends of that drum; a coil conductor formed on the drum; and external electrodes that are electrically connected to the coil conductor; wherein the external electrodes are arranged between the brims.

The external electrodes are formed on an axis almost perpendicular to a central axis for the core. In addition, the external electrodes are formed on a base with a prescribed thickness on which the core is to be mounted.

The external electrodes are provided at positions that are not located on routes of magnetic fluxes for the core, and have sizes not overlapping with the routes of magnetic fluxes.

The chip coil has at least four external electrodes. In addition, all external electrodes are connected to the ends of the coil conductor.

Furthermore, the present invention has another configuration to solve the above-described problems. In other words, a printed circuit board for a chip coil according to the present invention, is one on which land patterns that allow mounting of any of one the above-given chip coils, and signal patterns extended from the land patterns are provided, wherein the land patterns are formed to be able to connect to the external electrodes of the chip coil, and the land patterns and the signal patterns are formed to prevent from overlapping with the brims of the chip coil when mounting the chip coil and viewed from above.

The land patterns include dummy patterns for fixing the chip coil on the printed circuit board. In addition, the signal patterns are extended from the undersurface of the chip coil on the printed circuit board.

The present invention allows reduction in magnetic loss of the coil and prevents decrease in the Q value due to the electrodes of the coil and the land patterns.

In addition, the present invention facilitates formation of wiring patterns on the printed circuit board without interfering magnetic flux issued from the coil.

DETAILED DESCRIPTION OF THE INVENTION

Embodiments of the present invention are described forthwith in detail while referencing the attached drawings.

(First Embodiment)

Figure 1:
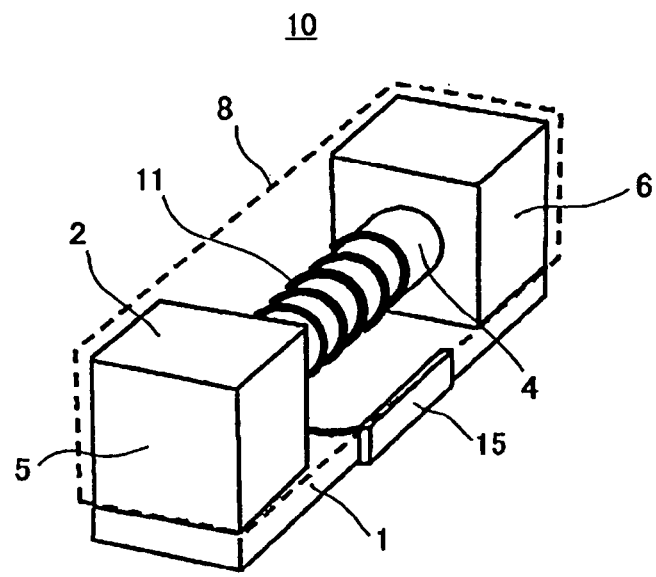
FIG. 1 is a perspective view showing an example of an internal configuration of a chip coil according to a first embodiment of the present invention.
Figure 2:
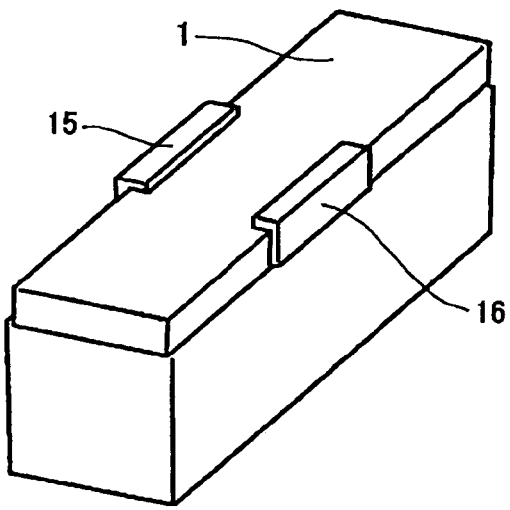
FIG. 2 is a perspective view showing a configuration of the chip coil underside according to the first embodiment.
Figure 3:
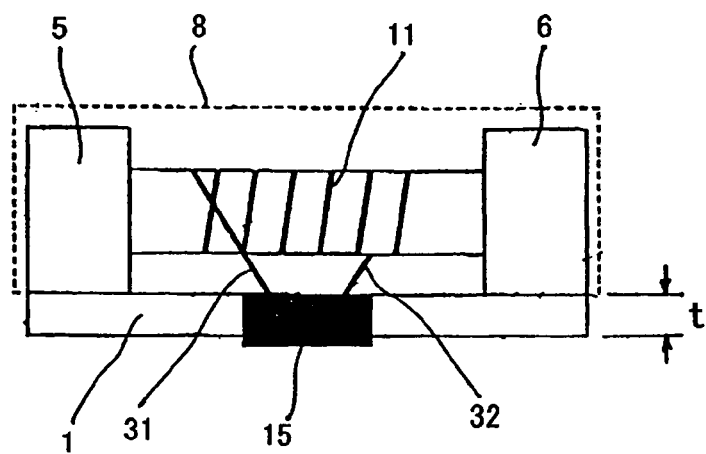
FIG. 3 is a front view of the chip coil according to the first embodiment.

To begin with, a configuration and a chip coil manufacturing process according to the first embodiment of the present invention are described. FIG. 1 is a perspective view showing an example of an internal configuration of the chip coil according to the first embodiment. FIG. 2 is a perspective view showing a configuration of the chip coil underside shown in FIG. 1. In addition, FIG. 3 is a front view of the chip coil according to the first embodiment. FIGS. 4A through 4D show a chip coil manufacturing process according to the first embodiment.

FIG. 1 shows a partial perspective view of the internal configuration of the chip coil according to this embodiment. As shown in FIG. 1, a chip coil 10 has a base 1 with a certain thickness to be described later and a core 2, which is mounted on that base 1. Here, the core 2 is made up of a core drum 4 configuring the center thereof, and brims 5 and 6 provided at both ends of that core drum 4. The base 1 is made of a material, such as a resin substrate or an inorganic material mainly containing alumina, which does not influence the magnetic fluxes issued from the coil.

Note that when the chip coil according to this embodiment is used as a wireless antenna for short-haul wireless communications, the material of the base 1 may influence the Q value and sensitivity of the antenna. Therefore, it is important to select a material which allows prevention of decrease in those characteristics. In addition, the core 2 is made of a magnetic material with high permeability, such as ferrite.

A conductive wire 11 is wound around the core drum 4 a prescribed number of times so that the inductance of the chip coil 10 can reach a desired value. That conductive wire 11 is made up of a coated copper wire insulated by resin (e.g., a polyurethane-coated copper wire or a polyimide-coated copper wire).

A pair of electrodes 15 and 16, which faces each other, is formed almost at the center of the length (the direction toward the central axis) of the base 1. Those electrodes 15 and 16 are arranged so as to penetrate into a part of the base 1 as shown in FIG. 2 to allow application to various environments, such as in-vehicle usage which brings about an environment with frequent mechanical vibrations. This configuration secures the bonding strength among the electrodes 15 and 16 and the base 1 at a constant level or greater.

In addition, both ends (conductive wire ends 31 and 32 shown in FIG. 3) of the above-described conductive wire 11 are connected to the electrodes 15 and 16, respectively. Note that: the electrodes 15 and 16 are made from copper (Cu), for example; the surfaces thereof are coated with nickel (Ni) or solder; each of the lengths thereof is shorter than that of the core drum 4 so as to reduce the influence on magnetic fluxes; and the electrodes 15 and 16 are arranged between (inner side) the brims 5 and 6 of the core.

In the case of the chip coil according to this embodiment, the thickness t of the base 1 (distance between the surface of a printed circuit board and a core (the bottoms of the brims 5 and 6) shown in FIG. 3) and the influences of the circuit patterns on magnetic fluxes and the Q value must be considered. Therefore, according to the chip coil of this embodiment, arrangement of the electrodes 15 and 16 at the center of the base 1 reduces the influence of the circuit patterns and the electrodes themselves on magnetic fluxes as described later.

In the case of the chip coil according to this embodiment, the thickness t of the base 1 is desirable to be t=0.3 mm or greater, for example, as shown in FIG. 3. In the case of the thickness t of the base 1 being thinner than 0.3 mm, influence of the circuit patterns is great. On the other hand, in the case of the thickness t of 0.3 mm or greater, influence on the Q characteristics decreases.

Further, if the thickness t is 1.0 mm or greater, there is less variation in the influence on the Q characteristics. According to these findings, it is desirable that the thickness t of the base 1 falls within the range between 0.3 and 1.0 mm when considering not only the electrical characteristics of the chip coil, but also reduction in height of components to be mounted on the printed circuit board. This means that change in the thickness t of the base 1 allows adjustment of the influences of circuit patterns on magnetic fluxes and the Q value.

Next, a chip coil manufacturing process according to the first embodiment is described. To begin with, in the first manufacturing step shown in FIG. 4A, a pair of electrodes 15 and 16 is fixed almost at both central edges of the base 1 with a prescribed thickness, which is made of a material not influencing magnetic fluxes issued from the coil as described above, such as a resin substrate or an inorganic material like alumina. In the next step shown in FIG. 4B, a conductive wire 11, which is a copper wire coated with an insulating material, is wound around the core drum 4, which is made of ferrite, until reaching a desired inductance value.

Figure 4A:
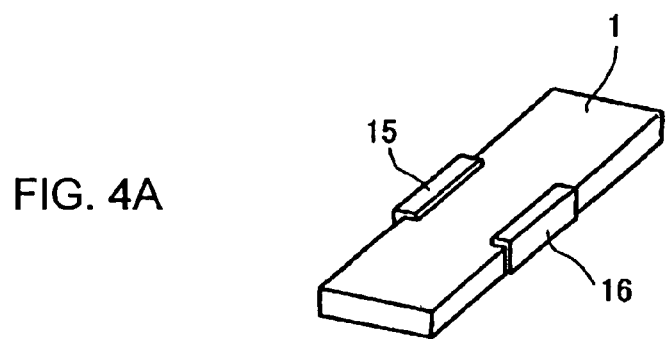
FIGS. 4A through 4D show a chip coil manufacturing process according to the first embodiment.
Figure 4B:
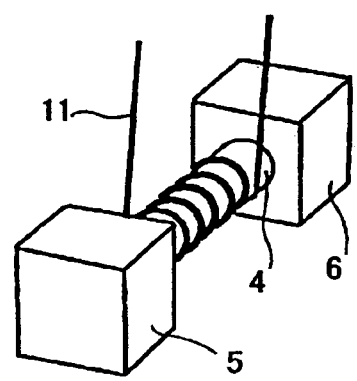
Figure 4C:
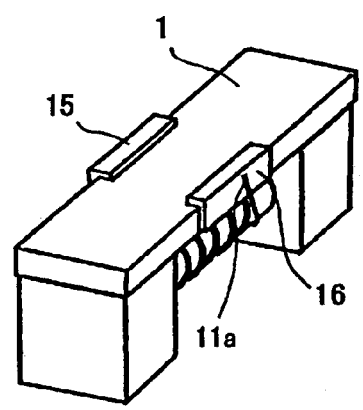
Figure 4D:
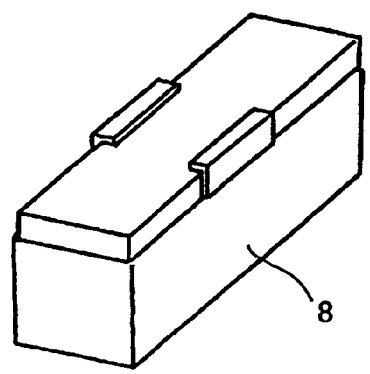

In a step shown in FIG. 4C, a core and the base 1 manufactured in the above-described step are bonded together, and both ends of the conductive wire 11 (only one end 11a is shown in FIG. 4C) are connected and fixed to the electrodes 15 and 16, respectively. In a process shown in FIG. 4D, the top of the coil main body is then coated with a resin mold 8 such as epoxy resin, or is covered with a resin cap and filled in with resin. This increases tolerance of mechanical vibrations of the coil and humidity.

Figure 5:
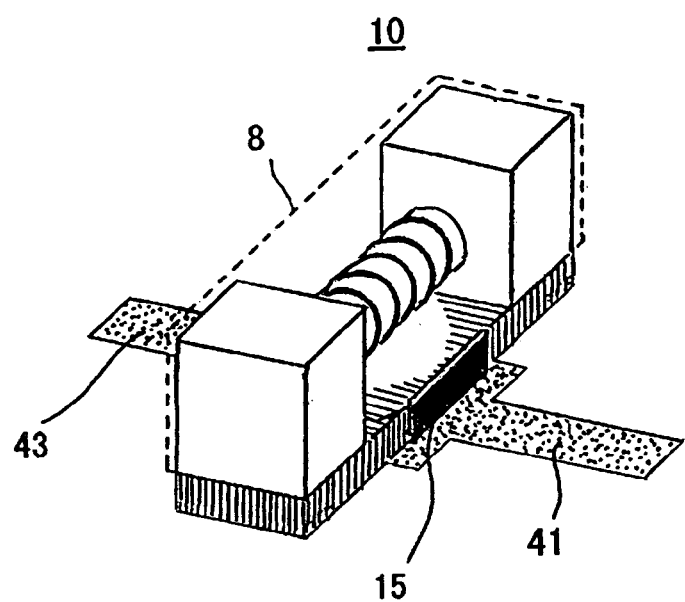
FIG. 5 shows the chip coil according to the first embodiment when mounted on a printed circuit board.

FIG. 5 is a perspective view showing the chip coil according to this embodiment when mounted on the printed circuit board. As shown in FIG. 5, by soldering the electrodes 15 and 16 almost at the center of the base 1 on the respective land patterns formed at the tips of signal patterns (signal lines) 41 and 43 on the board (not shown in the drawing), the chip coil 10 is fixed on the printed circuit board. As described above, the entirety of the chip coil shown in FIG. 5 is coated with the resin mold 8.

Next, influences of the circuit pattern of the chip coil according to this embodiment on magnetic fluxes are described. As described above, since the electrodes 15 and 16 of the chip coil 10 according to this embodiment are provided almost at the center of the base 1, when the chip coil 10 is mounted on the printed circuit board, the signal lines 41 and 43 on that printed circuit board run almost perpendicular to the length of the chip coil 10 at the center thereof, as shown in FIG. 5.

Figure 6:
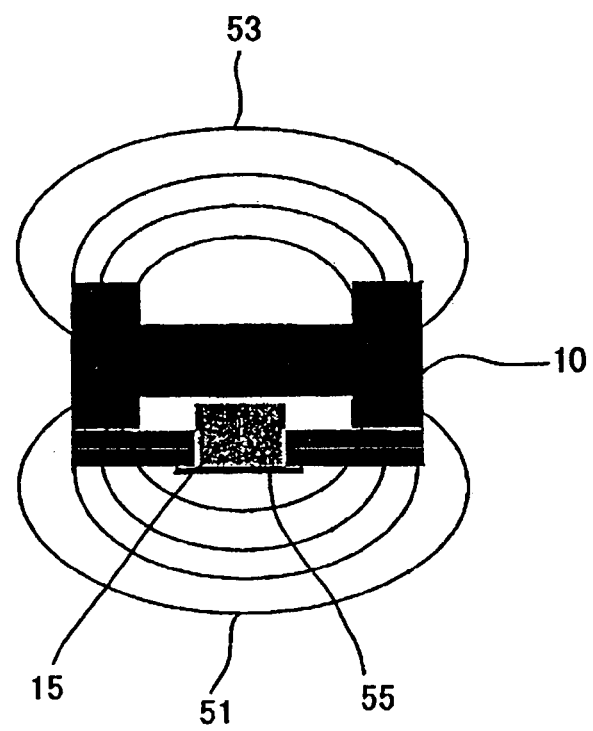
FIG. 6 shows running routes of magnetic fluxes in the chip coil according to the first embodiment.

This means that the routes of magnetic fluxes 51 and 53 of the chip coil 10 or the magnetic flux routes running in the surface of the coil wound around the core drum 4 reaching the exterior of the coil (free space) and returning again to the coil surface are not broken or divided along the way, as shown in FIG. 6. Therefore, according to the chip coil of this embodiment, since the electrodes 15 and 16 and the land pattern 55 are not provided at the positions that influence the magnetic fluxes 51 and 53, the magnetic loss of the coil 10 decreases, and is not cause for the Q value to decrease.

(Second Embodiment)

Figure 7:
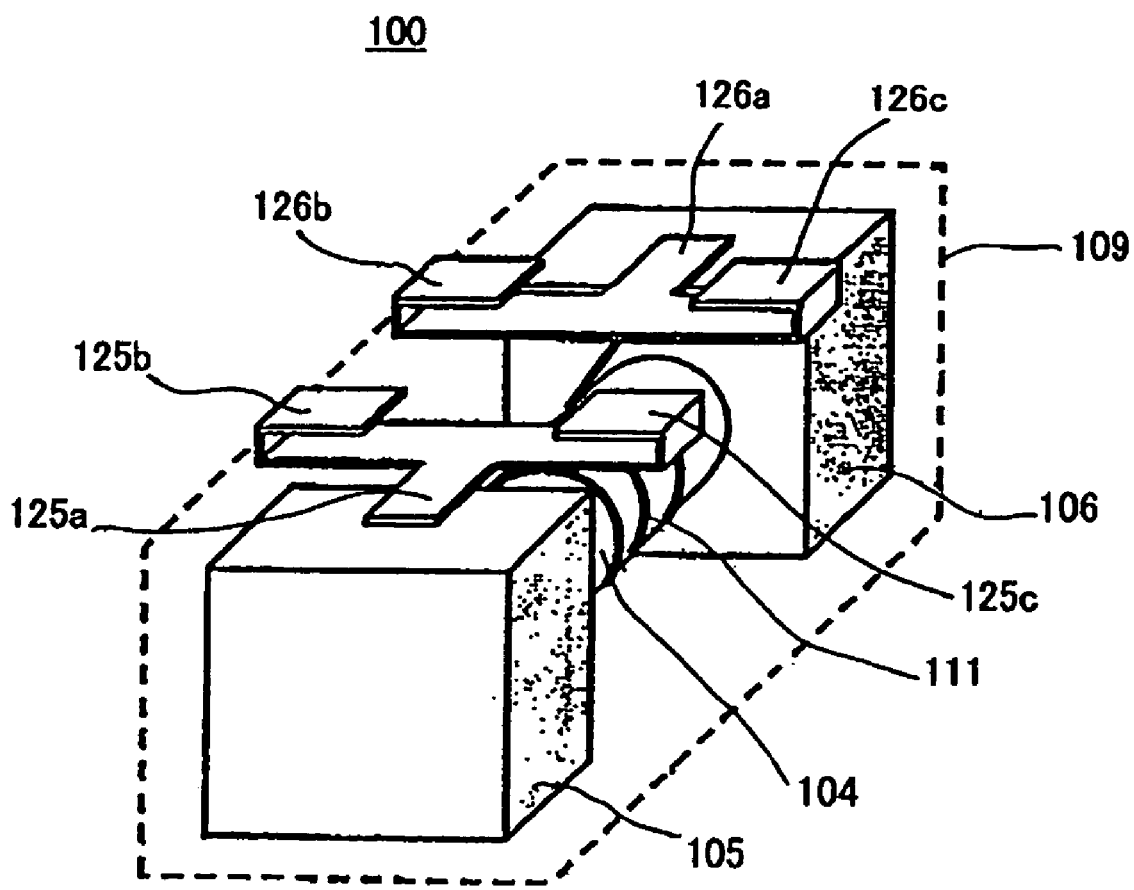
FIG. 7 is a perspective view showing a configuration of a chip coil according to a second embodiment of the present invention.
Figure 8A:
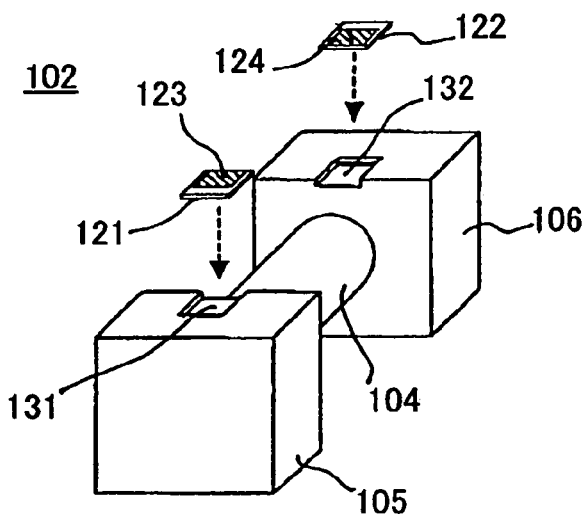
FIGS. 8A through 8F show a chip coil manufacturing process according to the second embodiment.
Figure 20:
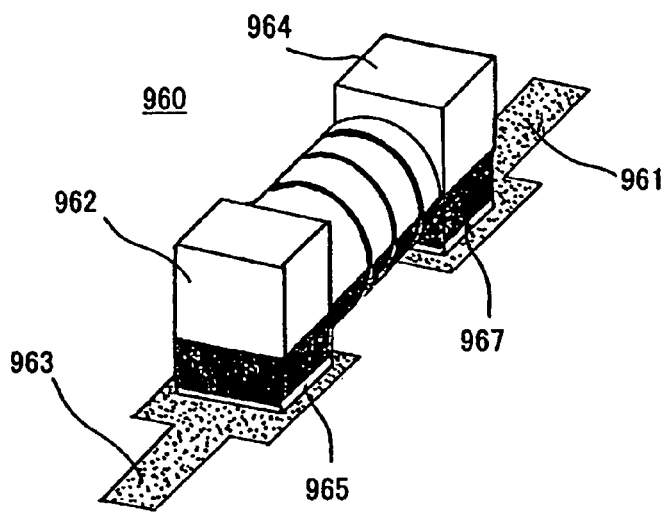
FIG. 20 shows the conventional chip inductor when mounted on a printed circuit board.
Figure 21:
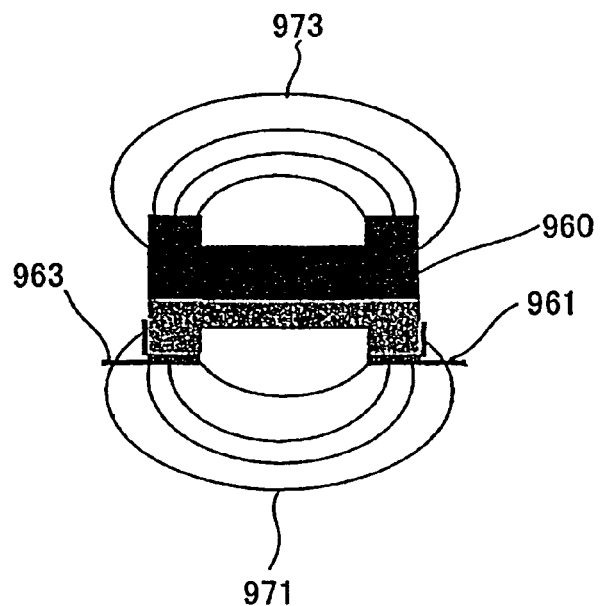
FIG. 21 shows running routes of magnetic fluxes of the conventional chip inductor.

The second embodiment according to the present invention is described forthwith in detail. FIG. 7 is a perspective view showing an entire configuration of a chip coil according to the second embodiment. The chip coil according to the second embodiment is manufactured through the steps described below, and has an internal configuration shown in FIG. 7. In other words, fixation of ends 111a and 111b (see FIG. 8B) of a conductive wire, which configures a coil conductor 111, on internal electrodes 123 and 124 (see FIG. 8A), respectively, allows connection of those ends 111a and 111b to conductive parts 125a and 126a, respectively, on top of brims 105 and 106, which are provided at both ends of the core drum 104. Those conductive parts 125a and 126a extend toward the center of the length of the core conductor 104, and external electrodes 125b, 125c, 126b, and 126c protrude from an external packaging 109, and bent along the surface of the external packaging 109. In other words, the chip coil according to the second embodiment does not have a configuration where the electrodes are formed at both ends of the coil length as with the conventional chip coil shown in FIG. 20, but has a configuration where the positions of the electrodes shift toward the center of the length of the chip coil 100.

In addition, the external electrodes 125b, 125c, 126b, and 126c of the chip coil according to this embodiment have a configuration where the portions (bent portions shown in FIG. 8F) protruding from the external packaging 109 are not fixed to the exterior resin, as described later. Therefore, even if the board is deflected by external forces after having mounted the chip coil 100 on the printed circuit board, the external electrodes 125b, 125c, 126b, and 126c exhibit flexibility along that deflection. This prevents connections between electrodes and corresponding patterns on the board from breaking (solder crack) due to deflection of the printed circuit board.

A chip coil manufacturing process and a configuration of a chip coil according to the second embodiment are described forthwith in detail. FIGS. 8A through 8F show the steps of manufacturing the chip coil according to this embodiment. In the step shown in FIG. 8A, boards 121 and 122 are fixed to a core 102 of the chip coil. Those boards 121 and 122 are ceramic insulator substrates on which thin metal films made from copper (Cu) are formed configuring internal electrodes 123 and 124.

Concave portions 131 and 132, having sizes corresponding to those of the above-described boards 121 and 122, respectively, are provided on top of the brims 105 and 106 at the ends of the core drum 104. The boards 121 and 122 are fixed to those concave portions 131 and 132, respectively, using an adhesive.

Figure 22:
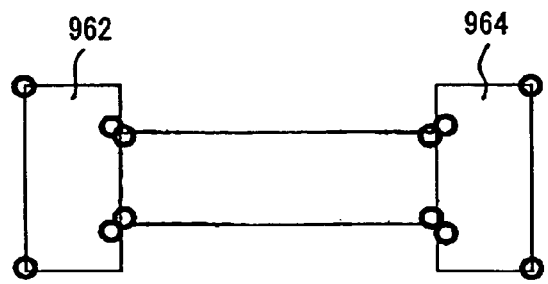
FIG. 22 shows magnetic flux concentrated portions of the chip inductor as a result of an electromagnetic field simulation.

Note that positions on top of the brims 105 and 106 for fixing the internal electrodes 123 and 124 may be positions other than the magnetic flux concentrated regions in FIG. 22, for example, and although omitted from the drawing, they may be at the respective centers on top of the brims 105 and 106. When viewing the chip coil from above, each of the widths of the internal electrodes (metal thin films) 123 and 124 is smaller than that of the core drum 104, and the positions of those internal electrodes are determined to fall within the width of the core drum 104 of the core 102 (more detailed description will be given referencing FIG. 9).

In addition, the reason why thin metal films are not directly formed on the brims 105 and 106 is to prevent the thin metal film from peeling off the core 102 due to difference in the thermal contraction ratio between the thin metal film and the core 102, which is made of a magnetic material with high permeability, such as ferrite. The internal electrodes 123 and 124 are formed in the core 102 to facilitate mass production of the chip coil by providing portions that allow fixation of the ends of a conductive wire, which becomes a coil conductor 111, in the core 102.

Figure 8B:
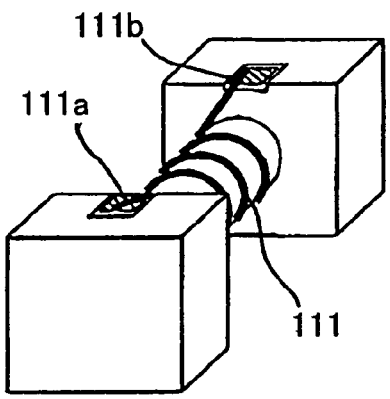

In the step shown in FIG. 8B, the coil conductor 111 is formed by winding a conductive wire around the core drum 104 of the core 102 a prescribed number of times so that the inductance of the chip coil can reach a desired value. The ends 111a and 111b of that conductive wire are connected to the internal electrodes 123 and 124, respectively. A polyurethane-coated copper wire or a polyimide coated wire is used as the conductive wire. In addition, connection of the ends 111a and 111b to the internal electrodes 123 and 124 is carried out using metal diffusion, conductive adhesives, or welding.

Figure 8C:
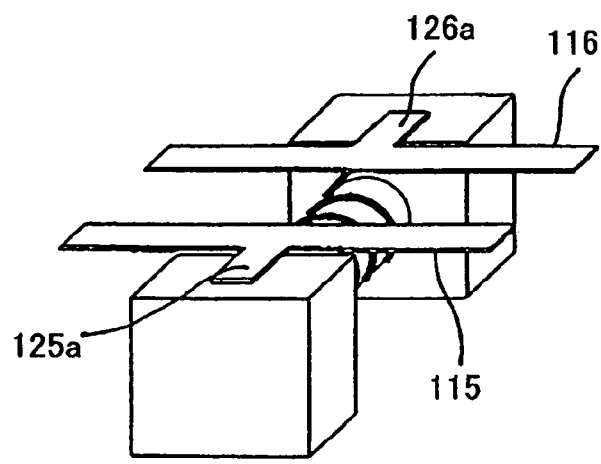

In the next step, lead frames 115 and 116 are fixed. In this step, a conductive part 125a of the T-shaped lead frame 115 is connected and fixed to the end 111a of the coil conductor 111 on the internal electrode 123 as shown in FIG. 8C. On the other hand, a conductive part 126a of the lead frame 116 is connected and fixed to the end 111b of the coil conductor 111 on the internal electrode 124. As described above, each of the widths of the conductive parts 125a and 126a is smaller than that of the core drum 104. This allows arrangement thereof so that they can fall within the width of the core drum 104.

Plated oxygen-free copper (H or (½)H) is used as the lead frames 115 and 116. In addition, the lead frames 115 and 116 are fixed to the internal electrodes 123 and 124, respectively, using a method of metal diffusion, welding, soldering, or using a conductive adhesive. The internal electrodes 123 and 124 are not limited to a rectangle as shown in the drawing, and may be a circle or an ellipse as long as the lead frames 115 and 116 can be fixed thereto, there is a sufficient area for bonding to the ends 111*a* and 111*b* of the conductive wire described above, and a constant bonding strength can be kept.

Figure 8D:
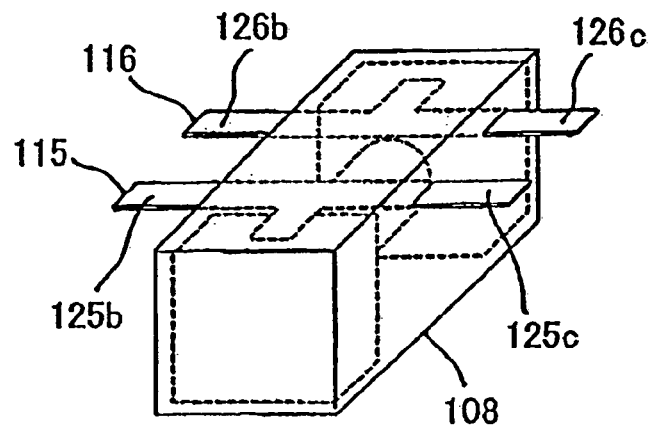

In a step shown in FIG. 8D, the core 102 to which the lead frames 115 and 116 are fixed is entirely coated with resin 108 so that parts of lead frames 115 and 116 can protrude from both ends of the chip coil width, respectively, and that the external electrodes 125*b*, 125*c*, 126*b*, and 126*c* can be formed. Rubber elastic silicon resin is used as the resin 108 to seal the entire chip coil. This absorbs stress and shock to the core 102, resulting in improvement of tolerance of mechanical vibrations and humidity. Note that the resin 8 to be used for sealing may be low-stress epoxy resin.

Figure 8E:
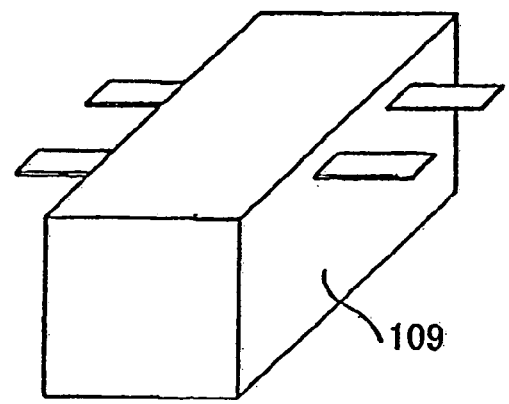
Figure 8F:
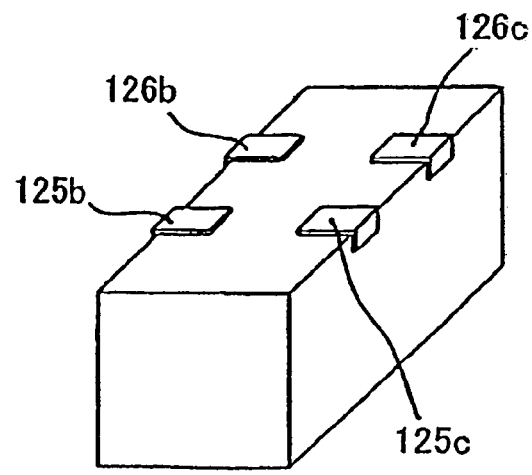

In the next step, an external packaging is formed. In other words, as shown in FIG. 8E, the external packaging 109 is formed by sealing with epoxy resin. In the next step shown in FIG. 8F, the external electrodes 125*b*, 125*c*, 126*b*, and 126*c* of the lead frames 115 and 116 are bent to form electrodes of the chip coil.

Figure 9:
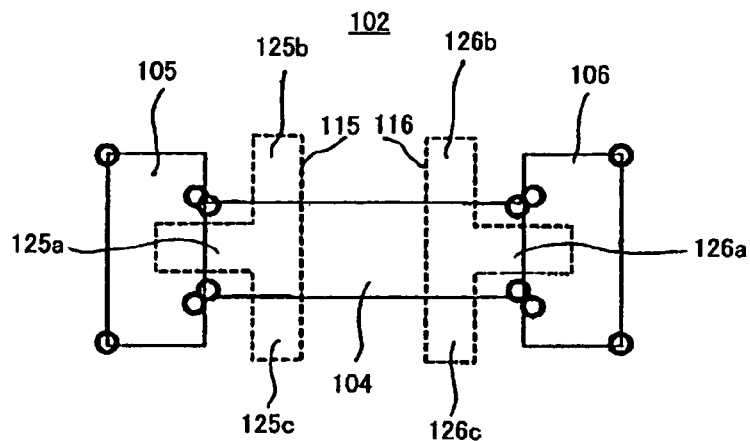
FIG. 9 is a diagram describing an arrangement of the electrodes of the chip coil according to the second embodiment.

FIG. 9 is a diagram describing an arrangement of the electrodes of the chip coil according to this embodiment. Magnetic flux concentrated portions of the chip coil have been found through the above-described electromagnetic field simulation. Magnetic flux concentrated portions are indicated by symbols (O) in FIG. 9. Major concentrated portions are four corners of both ends of the core 102, which is made up of the core drum 104 and the brims 105 and 106, and four corners of both ends of the core drum 104.

According to the chip coil of this embodiment, the T-shaped lead frames 115 and 116 are used as electrodes and arranged at portions other than the magnetic flux concentrated portions so as to prevent those electrodes from overlapping with those magnetic flux concentrated portions, as shown in FIG. 9. The lead frames 115 and 116 are T-shaped and made up of strip-shaped portions having external electrodes 125*b*, 125*c*, 126*b*, and 126*c* on respective both ends, and conductive parts 125*a* and 126, which extend perpendicular to those strip-shaped portions almost at the center thereof.

The conductive parts 125*a* and 126*a* are fixed to the brims 105 and 106, respectively, using the above-described method, and extend toward the center of the core 102. On the other hand, the external electrodes 125*b*, 125*c*, 126*b*, and 126*c* are extended so as to protrude from the sides of the core drum 104. As is apparent from FIG. 9, each of the widths of the conductive parts 125*a* and 126*a* is smaller than that of the core drum 104. By arranging them within the width of the core drum 104, the lead frames 115 and 116 cannot overlap with the magnetic flux concentrated portions when the core 102 is viewed from above.

(Third Embodiment)

A third embodiment according to the present invention is described forthwith. FIGS. 10A through 10D show configurations of a chip coil according to the third embodiment. The chip coil according to this embodiment is an example of a chip coil having electrodes with the same configuration as that of the electrodes of the chip coil according to the above-described first embodiment, which is manufactured through the same steps as those for the chip coil according to the second embodiment.

Figure 10A:
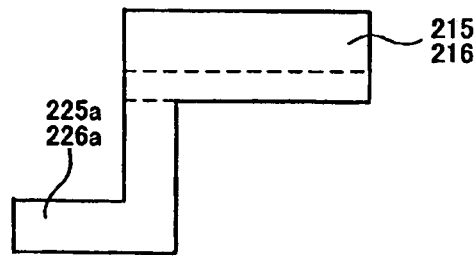
FIGS. 10A through 10D show a chip coil manufacturing process according to a third embodiment.
Figure 10B:
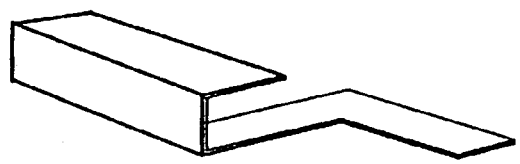
Figure 10C:
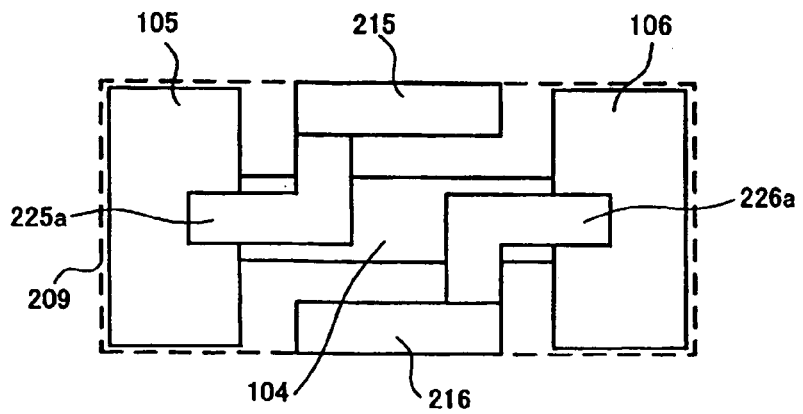
Figure 10D:
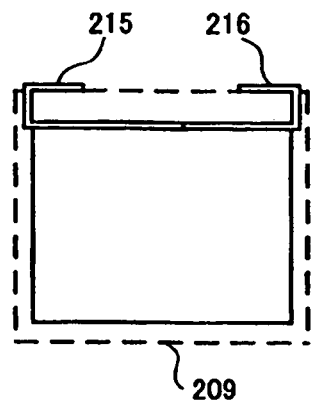

FIG. 10A shows the exterior (planar view) of a lead frame used as an electrode of the chip coil according to the third embodiment. FIG. 10B is a perspective view of an electrode formed by bending that lead frame. In addition, FIG. 10C shows a planar view of the entire chip coil. FIG. 10D shows a lateral view when viewing along the chip coil length. As described above, since the magnetic flux concentrated portions of the chip coil have been found, the shapes of the electrodes and the deployed positions thereof should avoid those magnetic flux concentrated portions.

According to the third embodiment, lead frames 215 and 216 of the shape shown in FIG. 10A are prepared, and the ends 225*a* and 226*a* thereof are fixed to internal electrodes formed on a core of the chip coil as with the above-described chip coil shown in FIG. 7 and FIGS. 8A through 8F. The coil is entirely coated with sealing resin, an external packaging 209 is formed, and the lead frames 215 and 216 are bent, forming electrodes (external electrodes) of the chip coil.

In the case of the chip coil according to this embodiment, by bending the lead frames 215 and 216 along the dashed line shown in FIG. 10A, external electrodes with the external shape shown in FIG. 10B are formed. As a result, when viewing along the chip coil length, electrodes are bent into a horseshoe-shape, as shown in FIG. 10D, and arranged so as to face each other on the core (see FIG. 10C).

(Wiring Pattern for Mounting Chip Coil)

Figure 11:
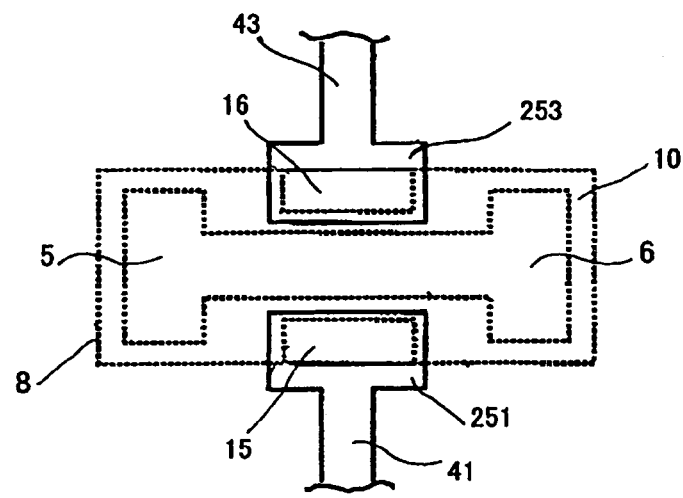
FIG. 11 shows an example of a land pattern for mounting the chip coil according to the embodiments.

Next, a land pattern for mounting the above-described chip coil on a printed circuit board is described. FIG. 11 shows an example of a land pattern for mounting the chip coil according to the first embodiment and/or the third embodiment shown in FIG. 1 and FIGS. 10A through 10D. As described while referencing FIG. 5, rectangular land patterns 251 and 253 as shown in FIG. 11 are provided at the respective tips of signal patterns (signal lines) 41 and 43 provided on the printed circuit board. Those land patterns 251 and 253 are aligned with the electrodes 15 and 16 of the chip coil 10, and arranged so as to face each other, and have a sufficient area for soldering those electrodes.

As shown in FIG. 11, the signal patterns 41 and 43 and the land patterns 251 and 253 are arranged at the positions that do not allow overlapping with the brims 5 and 6 of the core of the chip coil 10. In other words, by not arranging a conductor at magnetic flux concentrated portions of the core as shown in FIG. 22 and also magnetic flux interfering positions, implementation of a favorable inductance value and Q value for the chip coil is possible.

Figure 12:
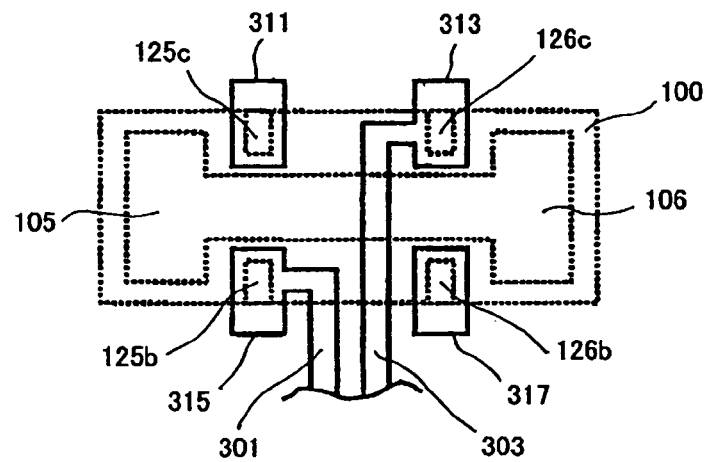
FIG. 12 shows another example of a land pattern for mounting the chip coil according to the embodiments.
Figure 13:
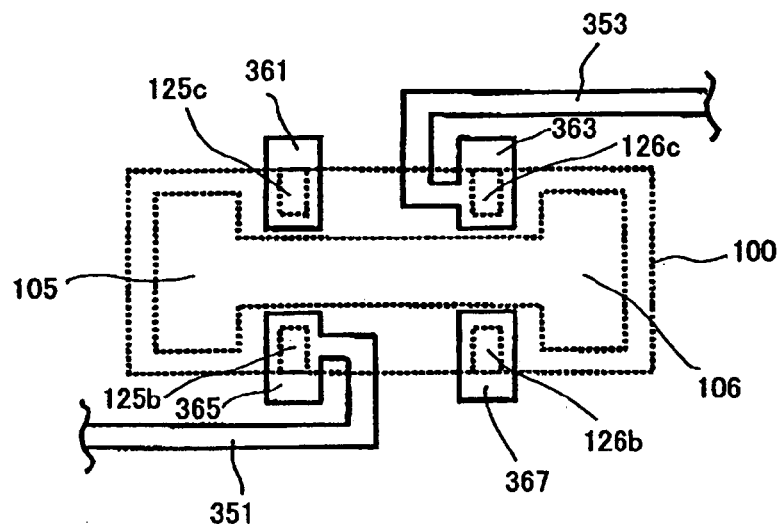
FIG. 13 shows still another example of a land pattern for mounting the chip coil according to the embodiments.

FIGS. 12 and 13 are examples of land patterns for mounting the chip coil according to the second embodiment shown in FIG. 7. According to the example shown in FIG. 12, four rectangular land patterns 315, 311, 317, and 313 are provided aligned with four external electrodes 125*b*, 125*c*, 126*b*, and 126*c* of the chip coil 100. Those land patterns have sufficient areas for soldering the external electrodes of the chip coil 100, respectively, and signal patterns (signal lines) 301 and 303 are provided for the land patterns 315 and 313 as the ending portions.

Similarly, according to the example shown in FIG. 13, four rectangular land patterns 365, 361, 367, and 363 are provided aligned with four external electrodes 125*b*, 125*c*, 126*b*, and 126*c* of the chip coil 100, and signal patterns (signal lines) 351 and 353 are provided for the land patterns 365 and 363 as the ending portions. In addition, those land patterns also have sufficient areas for soldering the external electrodes of the chip coil, respectively, as with the example shown in FIG. 12.

As described above, in the examples shown in FIGS. 12 and 13, the land patterns and the signal patterns connected thereto are provided at positions that do not allow overlapping with the brims 105 and 106 of the core of the chip coil in order to provide conductors at positions that do not allow interfering magnetic fluxes from the core. As a result, with those land patterns, by avoiding magnetic flux concentrated portions of the core, a favorable inductance value and Q value for the chip coil can be obtained.

Note that in the examples shown in FIGS. 12 and 13, the land patterns 311, 317, 361, and 367 are dummy patterns to which no signal pattern is connected, or land patterns formed for fixing the chip coil on the printed circuit board. Existence of these patterns allows stronger and more stable fixation of the chip coil on the printed circuit board, resulting in secure bonding strength between the chip coil and circuit patterns (land patterns) in an environment with frequent vibrations.

Next, while referencing actually measured values obtained by measuring samples, differences between the case of providing conductors at positions allowing interfering magnetic fluxes from the chip core and the case of providing conductors at positions not allowing such interference are qualitatively compared and explained.

Figure 14:
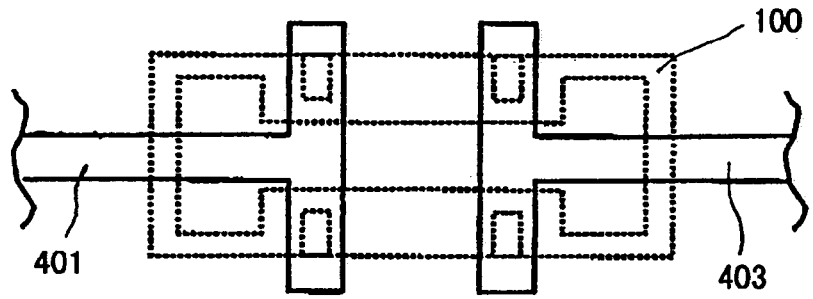
FIG. 14 shows an example of a conductor pattern provided so as to overlap with magnetic flux concentrated portions of the core.
Figure 15:
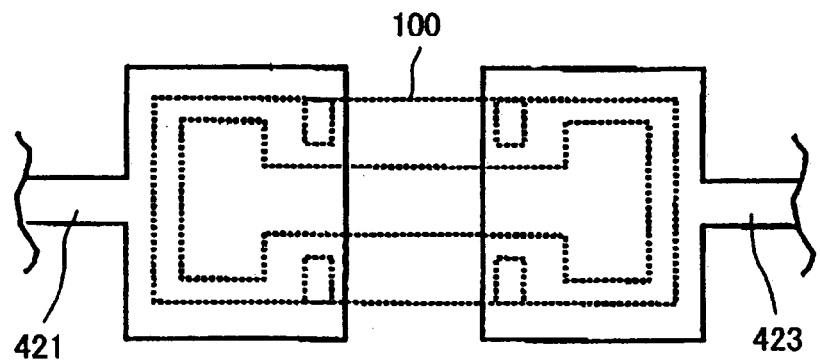
FIG. 15 shows another example of a conductor pattern provided so as to overlap with magnetic flux concentrated portions of the core.

For this comparison, as an example of the case of providing conductors at positions not allowing such interference, an example of the chip coil with the configuration shown in FIG. 7 mounted on the printed circuit board on which patterns in FIG. 12 are arranged (hereafter referred to as a 'working example') is used, while as an example of providing conductive patterns that overlap with magnetic flux concentrated portions, examples shown in FIGS. 14 and 15 are used. More specifically, FIG. 14 shows an example of signal patterns 401 and 403 on the printed circuit board running over the brims of the core of the chip coil 100 (referred to as a 'first comparative example'), while FIG. 15 shows an example of land patterns 421 and 423 themselves entirely covering the brims of the core of the chip coil 100 (referred to as a 'second comparative example').

Figure 16:
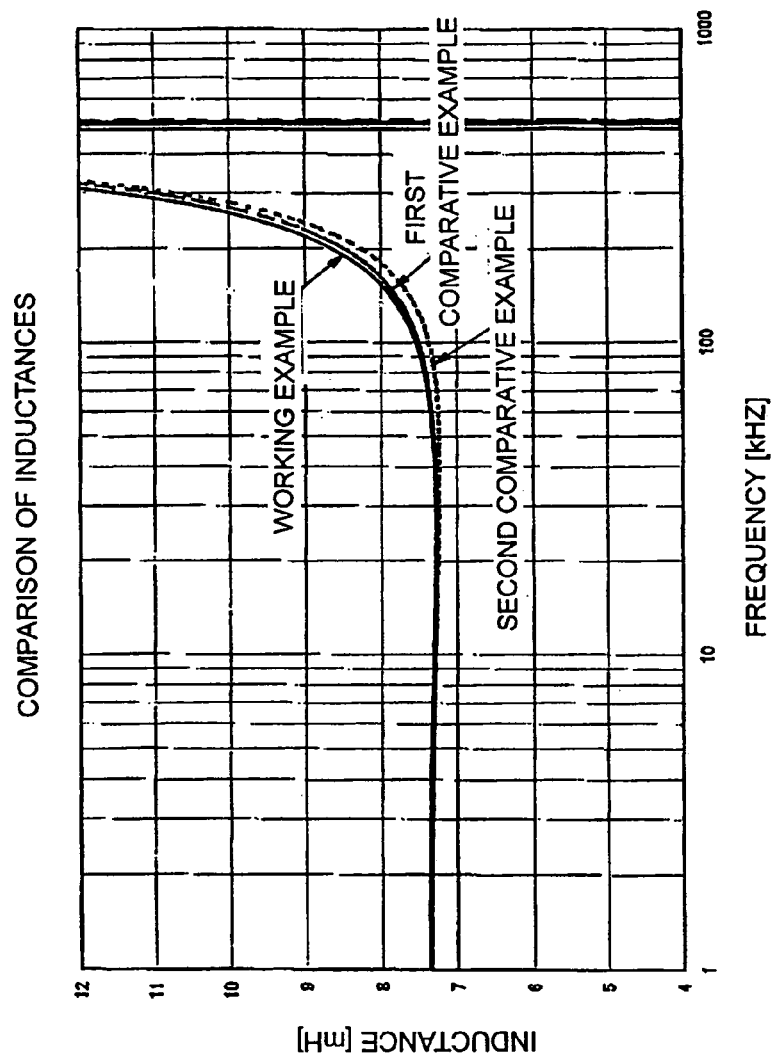
FIG. 16 shows comparison results of the inductance values of the embodiments and first and the second comparative examples.
Figure 17:
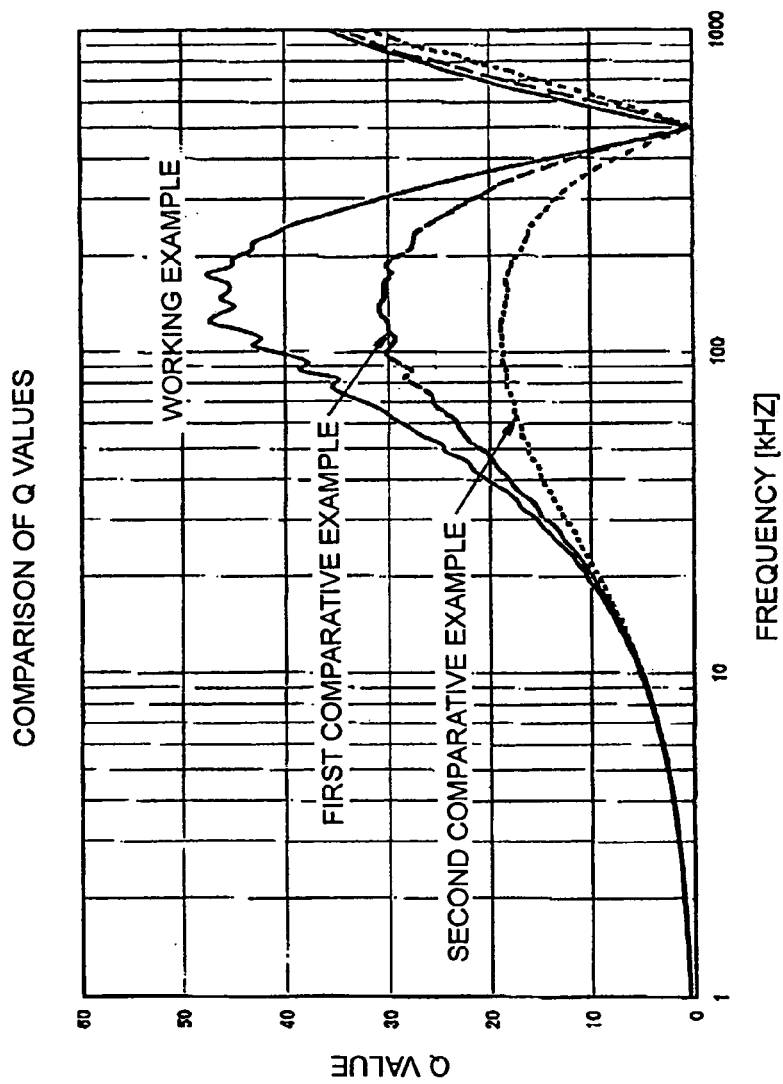
FIG. 17 shows comparison results of the Q values of the embodiments and the first and the second comparative examples.

FIG. 16 is a graph which shows inductance value comparison results among the working example and the first and the second comparative examples. FIG. 17 is a graph which shows Q value comparison results among the working example and the first and the second comparative examples. In both cases, the horizontal axis indicates frequency (kHz). According to this working example, as described above, the chip coil having a chip size of 7.0×3.0×3.0 (mm) is provided on the printed circuit board with the pattern structure shown in FIG. 12. This chip coil has an inductance of 7.2 mH at 125 kHz, which is measured using the measuring instrument Agilent 4294A and the measuring jig 16193A.

In the examples shown in FIGS. 16 and 17, measurement is carried out using the measuring instrument Agilent 4294A under conditions where the signal level is 500 mV and the measuring frequency range is between 1 kHz and 110 MHz. According to FIG. 16, when the frequency is at 125 kHz, for example, the inductance for the working example is 7.7245 mH, that for the first comparative example is 7.6548 mH, and that for the second comparative example is 7.496 mH. As a result, a wiring pattern not overlapping with the brims of the core of the chip coil has slightly improved the inductance.

On the other hand, as shown in FIG. 17, when the frequency is at 125 kHz, the Q value for the working example is 47.02, that for the first comparative example is 33.77, and that for the second comparative example is 18.78. There is remarkable difference among the working example and the comparative examples. Employment of the wiring pattern shown in FIG. 12 leads to extremely favorable Q value characteristics for the working example.

As described above, a pair of electrodes is formed almost at the center of the base on which the core of the chip coil is mounted, and those electrodes and land patterns are not arranged at the positions that influence magnetic fluxes from the core when the chip coil is mounted on the printed circuit board. This reduces magnetic loss for the coil and prevents decrease in the Q value due to the external electrodes and the land patterns.

In other words, arrangement of the electrodes of the chip coil at no magnetic flux concentrated positions of the core of the chip coil reduces magnetic loss of the coil, and prevents decrease in sensitivity and the Q value due to the electrodes and the land patterns. In addition, the land patterns and the signal patterns on the printed circuit board on which that chip coil is to be mounted are arranged so that the routes of magnetic fluxes of the coil cannot be broken or divided. This reduces magnetic loss and prevents decrease in sensitivity and the Q value due to the land patterns and the signal patterns.

Furthermore, since the land patterns do not interfere in magnetic fluxes, formation of transmission patterns to be extended from the land patterns is facilitated. At the same time, there is no need to deploy wiring including transmission patterns around the chip coil, resulting in reduction in size of area for forming patterns. This leads to improvement in packaging density of components on the printed circuit board.

Moreover, a configuration of the ends of external electrodes not fixed to exterior resin of the chip coil prevents break of connection of the patterns on the printed circuit board and the electrodes, and keeps electrical connection while securing a suitable bonding strength therebetween even if the printed circuit board on which the chip coil is mounted deflects. This increases reliability of communication equipment.

In addition, provision of dummy patterns for fixing the chip coil on the printed circuit board so that the electrodes of the coil can be soldered to connect to those patterns secures a suitable bonding strength between the coil and the printed circuit board. Furthermore, provision of at least four external electrodes at the chip coil where all of which is electrically connected to the coil conductor allows adaptation to various transmission patterns on the printed circuit board.

Note that the present invention is not limited to the above-described embodiments, and various changes are allowed within the range not deviating from the scope of the invention. For example, in the above-described embodiments, the conductive wire 11 shown in FIG. 1 and the coil conductor 111 shown in FIG. 7 may be formed by stacking green sheets, each having a coil pattern, or forming a thick or a thin metal coated film on the surfaces of the core drums 4 and 104.

Figure 18:
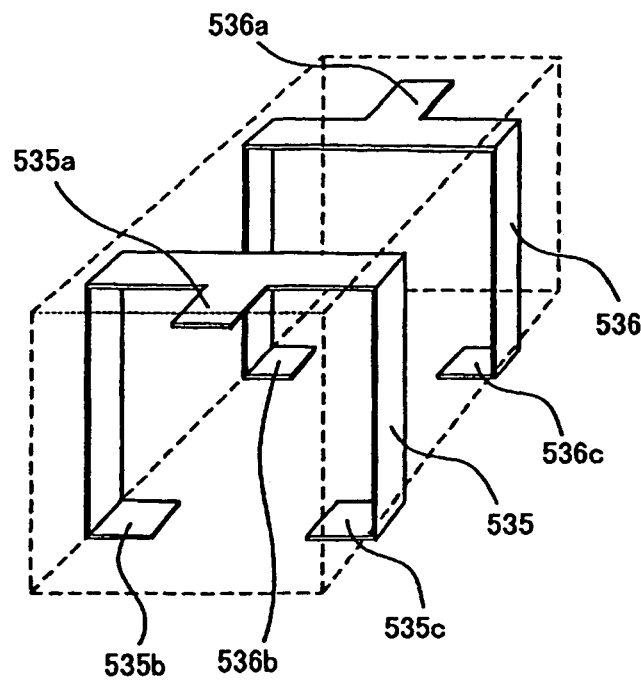
FIG. 18 shows a shape of a lead frame of a chip coil according to a modified example.

In addition, in the case of the lead frames for the chip coil according to the second embodiment, the lead frames 535 and 536 may be bent to form the shapes shown in FIG. 18, for example, and provide them at magnetic flux non-concentrated positions as with the above-described embodiments. In this case, conductive parts 535a and 536a of the lead frames 535 and 536 are provided on the internal electrodes (thin metal films) to which the ends of the conductive wire are connected, aligned so that the lead frames 535 and 536 can face each other, and then fixed.

Figure 19:
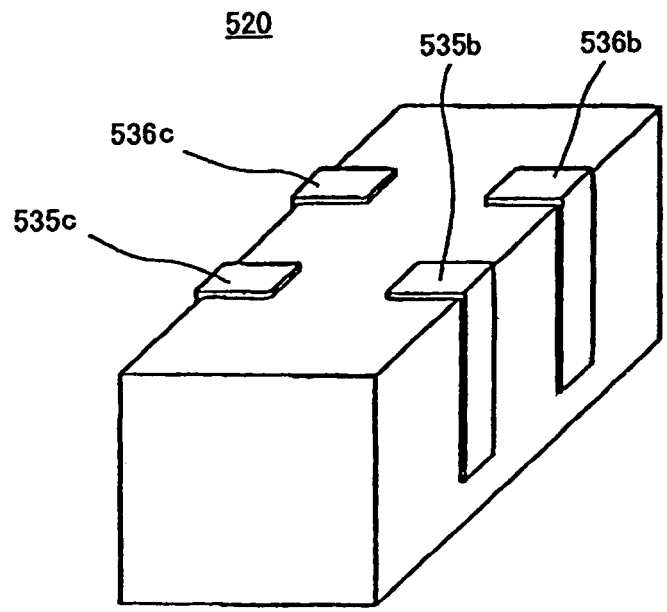
FIG. 19 is a perspective view of the exterior of the chip coil according to the modified example.

FIG. 19 is a perspective view of a chip coil according to this modified example. Chip coil 520 has a configuration where: the lead frames 535 and 536 shown in FIG. 18 partially protrude from both sides of the width of the chip coil 520, forming external electrodes 535b, 535c, 536b, and 536c; resin such as rubber elastic silicon resin is used to seal entirely; and the periphery is coated with epoxy resin. In other words, the chip coil 520 shown in FIG. 19 has electrodes which have a configuration where the lead frames 535 and 536 partially protrude from the top portion of the chip main body, extend to the bottom along the chip sidewalls, and are bent toward the bottom.

The external electrodes 535b, 535c, 536b, and 536c of the chip coil 520 are not fixed to the exterior resin on the outside of the chip main body. As a result, flexibility of the external electrodes can prevent break in connection of those electrodes and the patterns on the printed circuit board even if the printed circuit board is deflected by external forces after mounting the chip coil on the printed circuit board.

While the invention has been described with reference to particular example embodiments, further modifications and improvements which will occur to those skilled in the art, may be made within the purview of the appended claims, without departing from the scope of the invention in its broader aspect.

What is claimed is:

1. A chip coil comprising:
    a core including a drum and flange-shaped brims provided on both ends of said drum; and
    a coil conductor formed on said drum;
    wherein external electrodes that are electrically connected to said coil conductor are arranged between inner sides of said flange-shaped brims and close proximity to said drum; and
    wherein said external electrodes are at positions where routes of magnetic fluxes running in a surface of said coil conductor, reaching a free space and returning to the surface of said coil conductor are not broken along the way.

2. The chip coil according to claim 1, wherein said core includes a central axis and portions of said external electrodes extend in a line substantially perpendicular to said central axis.

3. The chip coil according to claim 2, further comprising: a base having edges and a prescribed thickness on which said core is to be mounted, wherein said external electrodes are disposed on substantially central parts of the edges of said base.

4. The chip coil according to claim 3, wherein a thickness of said base is adjusted to fall within a range between 0.3 mm and 1.0 mm so that signal patterns formed on a circuit board for mounting said chip coil to be able to connect to said external electrodes that are fixed to said base, are not located on the routes of the magnetic fluxes.

5. The chip coil according to claim 4, comprising at least four external electrodes.

6. The chip coil according to claim 5, wherein all of said external electrodes are connected to the ends of said coil conductor.

7. A chip coil comprising:
    a core including a drum, a first flange-shaped brim and a second flange-shaped brim, said first flange-shaped brim being disposed on one end of said drum and said second flange-shaped brim being disposed on an opposite end of said drum;
    a coil conductor formed on said drum; and
    external electrodes are electrically connected to said coil conductor and are arranged between and spaced from said first flange-shaped brim and said second flange-shaped brim so that said external electrodes are disposed adjacent to and spaced from said drum.

8. The chip coil according to claim 7, wherein said core includes a central axis and portions of said external electrodes extend in a line substantially perpendicular to said central axis.

9. The chip coil according to claim 8, further comprising: a base having edges and a prescribed thickness on which said core is to be mounted, wherein said external electrodes are disposed on substantially central parts of the edges of said base.

10. The chip coil according to claim 9, wherein a thickness of said base is adjusted to fall within a range between 0.3 mm and 1.0 mm so that signal patterns formed on a circuit board for mounting said chip coil to be able to connect to said external electrodes that are fixed to said base, are not located on the routes of the magnetic fluxes.

* * * * *